United States Patent [19]
Komori et al.

[11] Patent Number: 5,536,665
[45] Date of Patent: Jul. 16, 1996

[54] METHOD OF MANUFACTURING A SEMICONDUCTOR DEVICE WITH DOUBLE STRUCTURED WELL

[75] Inventors: Shigeki Komori; Takashi Kuroi; Masahide Inuishi, all of Hyogo-ken, Japan

[73] Assignee: Mitsubishi Denki Kabushiki Kaisha, Tokyo, Japan

[21] Appl. No.: 442,928

[22] Filed: May 17, 1995

Related U.S. Application Data

[62] Division of Ser. No. 240,282, May 9, 1994, Pat. No. 5,446,305, which is a continuation of Ser. No. 867,738, Apr. 13, 1992, abandoned.

[30] Foreign Application Priority Data

Apr. 17, 1991 [JP] Japan ................................. 3-085537
Mar. 6, 1992 [JP] Japan ................................. 4-049869

[51] Int. Cl.⁶ ........................................... H01L 21/266
[52] U.S. Cl. .................... 437/26; 437/74; 437/149; 148/DIG. 85
[58] Field of Search .................... 437/26, 74, 75, 437/149, 150, 76, 77

[56] References Cited

U.S. PATENT DOCUMENTS

| | | | |
|---|---|---|---|
| 3,575,646 | 4/1971 | Karcher | 148/DIG. 85 |
| 4,672,426 | 6/1987 | Nakazato et al. | 257/378 |
| 5,031,019 | 7/1991 | Kosaka et al. | 257/371 |
| 5,065,212 | 11/1991 | Ohata et al. | 257/378 |
| 5,087,579 | 2/1992 | Tomassetti | 437/74 |
| 5,116,777 | 5/1992 | Chan et al. | 437/77 |
| 5,138,420 | 8/1992 | Komori et al. | 257/371 |
| 5,150,184 | 9/1992 | Eklund | 257/378 |
| 5,158,899 | 10/1992 | Yamagata | 437/74 |
| 5,198,880 | 3/1993 | Taguchi et al. | 257/371 |
| 5,304,833 | 4/1994 | Shigeki et al. | 257/371 |

FOREIGN PATENT DOCUMENTS

| | | |
|---|---|---|
| 298421 | 1/1989 | European Pat. Off. . |
| 1-189955 | 7/1989 | Japan . |

OTHER PUBLICATIONS

"Multilayered Well Formation for Sub–0.5 µm CMOS Devices Utilizing High Energy Ion Implantation" Extended Abstracts of the 21st Conference on Solid State Devices and Materials, by Kiyonori Ohuyu et al., Tokyo, 1989.

Primary Examiner—Chandra Chaudhari
Attorney, Agent, or Firm—Lowe, Price, LeBlanc & Becker

[57] ABSTRACT

A semiconductor device includes a p-type silicon substrate, a first well of p-type formed in a major surface of the silicon substrate, and a second well of n-type formed close to the first well in the major surface of the silicon substrate. A third well of p-type is formed inside the second well and, furthermore, a conductive layer including p-type impurities of higher concentration than that of the first well is formed as extending immediately below both the first well and the second well. In accordance with this structure, even if minority carriers are injected, they recombine and disappear in the conductive layer, so that the implantation of the carriers into the first well is prevented. As a result, various disadvantageous phenomena due to the injection of the minority carriers are prevented and a semiconductor device having a stable device characteristic and high integration density is provided.

9 Claims, 12 Drawing Sheets

METHOD OF MANUFACTURING A SEMICONDUCTOR DEVICE WITH DOUBLE STRUCTURED WELL

This application is a division of application Ser. No. 08/240,282, now U.S. Pat. No. 5,446,305, filed May 9, 1994, which is a continuation of Ser. No. 07/867,738, now abandoned, filed Apr. 13, 1992.

BACKGROUND OF THE INVENTION

1. Field of the Invention

The invention relates generally to semiconductor devices including a double structured well and manufacturing method thereof and, more particularly, relates to techniques for improving tolerance to injection of minority carriers caused by a noise from the outside of devices.

2. Description of the Background Art

With the advancement of miniaturization and increased integration density of semiconductor devices, one semiconductor device is being developed in which wells having both p and n conductivity types are formed close to each other in the neighborhood of the surface of a semiconductor substrate such as a single crystalline silicon substrate. In many cases, wells having a double structure for example, in which a p-type well is further formed inside an n-type well, are foiled for such a semiconductor device and there has been a problem of disadvantageous phenomena, such as a latch-up due to injection of minority carriers caused particularly in semiconductor devices including wells of such a double structure. One example of a conventional semiconductor device including double structured wells is a CMOS (Complementary Metal Oxide Semiconductor) described in "Extended Abstract of the 21st Conference of Solid State Devices and Materials, Tokyo, 1989, p 105–108". A conventional semiconductor device including double structured wells will now be described with reference to FIGS. 1 to 4.

Referring to FIG. 1, in the conventional semiconductor device including double structured wells, a p well 2, an n well 3 and an n well 4 are formed on the surface of a p-type silicon substrate 1 A p well 5 is further formed inside n well 3, and p well 2 and n well 4 are formed adjacent to the side portions of n well 3.

The operation in the structure of the conventional double structured wells above will now be described with reference to FIG. 1. When a voltage lower than that of a terminal 14 connected to a p$^+$ layer is instantaneously applied to a terminal 13 connected to an n$^+$ layer within p well 5, a current flows from terminal 14 to terminal 13. At this time, minority carriers of electrons are injected into p well 5 from terminal 13. The arrow A shown in FIG. 1 indicates the direction of the flow of the current in a solid line and the direction of the flow of the electrons in a broken line in this case. Though the minority carriers of electrons diffuse in the direction toward p well 2 as well, they are captured by the positive bias applied to a terminal 12 connected to an n$^+$ layer on the surface of n well 3, so that they do not reach p well 2.

The operation above can be also described in the same way, replacing terminal 13 and terminal 14 with terminal 15 and terminal 16, respectively, and further replacing p well 2 with p well 5. That is, when a voltage lower than that of terminal 16 is instantaneously applied to terminal 15, a current flows from terminal 16 to terminal 15, and minority carriers of electrons are injected into p well 2 from terminal 15. The electrons are also captured by the positive bias applied to terminal 12.

However, as the conventional double structured wells are structured as stated above, a parasitic bipolar transistor is formed with the n$^+$ layer connected to terminal 13 being the emitter, p well 5 being the base, and n well 3 being the collector. Therefore, if terminal 13 is negatively biased strongly by a strong, external noise, a current flows from n well 3 to the n$^+$ layer connected to terminal 13 by the bipolar operation. The arrows B in FIG. 1 indicate the direction of the current in a solid line and the direction of the flow of the electrons in a broken line. In this case, as there is a resistance component $R_z$ in n well 3, the portion 3a of the n well immediately below the n$^+$ layer connected to terminal 12 disadvantageously assumes a negative potential rather than a positive potential, resulting in injection of the minority carriers into p well 2.

In another case, the conventional structure of the double structured wells has an arrangement of wells as shown in FIG. 2. A problem of a latch-up phenomenon in a conductor device of this structure will now be described with reference to FIG. 2.

At first, injection of electrons is caused in the n$^+$ layer within a p well 25 surrounded by an n well 23 (see the arrow C of FIG. 2), the electrons enter a semiconductor substrate 21, and they pass a substrate resistor $R_s$ immediately below a p well 22 (the arrow D of FIG. 2). Accordingly, the base of a parasitic npn transistor 26 is biased, a base current flows, and a current flows into the n$^+$ layer within p well 22 from an n well 24 by the amplifying effect of parasitic npn transistor 26. As a result, a current flows in a parasitic resistor $R_g$ within n well 24, the base of a pnp transistor 27 is biased, and a current flows into the p$^+$ layer of n well 24 from p well 22 by the amplifying effect of pnp transistor 27. The bias of substrate resistor $R_s$ is thereby increased, applying a positive feedback to the operation above, resulting in a so-called latch-up phenomenon.

The injection of carriers above causes a store hold error in memory cells of a DRAM (Dynamic Random Access Memory), for example. Referring to FIG. 3, in this store hold error, the electrons are injected from the n$^+$ layer of a p well 44 (see the arrow E of FIG. 3), the electrons penetrate into a semiconductor substrate 41, further enter a p well 42, and are captured by the n$^+$ layer on the surface thereof (see the arrow F of FIG. 3). If the electrons captured by the n$^+$ layer enter a storage node 45 of the memory cell, storage node 45 kept at a positive level attains a negative level, causing a store hold error. Injection of electrons into p well 44 is mainly caused in three cases shown in FIG. 4: a case where the pn junction of p well 44 and the n$^+$ layer thereof is biased in the forward direction ([A] of FIG. 4); a case where a high $V_D$ is applied to the MOS transistor, a high drain current flows and hot carriers are generated ([B] of FIG. 4); and a case where irradiation of α rays is carried out, entering into p well 44, so that separation of a pair of electron and hole within p well 44 is caused ([C] of FIG. 4).

SUMMARY OF THE INVENTION

An object of the present invention is to provide a semiconductor device capable of preventing phenomena such as a latch-up, a storage hold error and so on causing adverse effects on elements due to injection of minority carriers by external noises.

A semiconductor device according to the present invention to achieve the above-mentioned object includes a semiconductor substrate of a first conductivity type, a first well of a first conductivity type, formed in a major surface of the semiconductor substrate, and a second well of a second conductivity type formed laterally adjacent to the first well of the first conductivity type in the vicinity of the surface of the semiconductor substrate. A third well of the first conductivity type is formed inside the second well, and furthermore, a conductive layer including first conductivity type impurities having a higher concentration than that of the semiconductor substrate is formed laterally extending immediately below both the first well and the second well.

In accordance with the structure, the conductive layer including the first conductivity type impurities of high concentration is provided from the side surface of the second well to a prescribed depth, so that even if injection of minority carriers is caused to the third well inside the second well, the minority carriers recombine in the conductive layer and disappear, so that they are not injected to the first well. Accordingly, in a case where memory cells of a DRAM i.e., elements which are likely to be destroyed by injection of carriers, for example, are formed on the surface of the first well, degradation of the characteristic due to the carrier injection can be prevented.

The semiconductor device having the structure stated above is particularly applied to the case where a second conductivity type layer of high concentration connected to an electrode terminal is formed on the surface of the third well, and a parasitic bipolar transistor is formed of the second conductivity type layer of high concentration on the surface of the third well, the third well itself, and the second well. In this case, as the minority carriers, the inflow thereof is amplified by the bipolar operation of the parasitic bipolar transistor, recombine and are captured in the conductive layer including the first conductivity type impurities, the penetration of the minority carriers into the first well can be controlled.

The semiconductor device having the above-mentioned structure is also applied to a structure where a latch-up phenomenon is likely to occur, controlling the latch-up phenomenon by capturing the minority carriers recombining in the conductive layer in the same way.

In a case of a preferred embodiment of the present invention where the conductive layer including the first conductivity type impurities is formed not only under the second well but at the boundary between the second well and the first well, even if injection of minority carriers is caused in the neighborhood of the boundary and the minority carries move in the lateral direction, the carriers are absorbed in the conductive layer and injection from the side portion into the first well is also prevented.

In another preferred embodiment of the present invention, a first conductivity type impurity layer having a higher concentration than the impurity concentrations of the first and third wells is provided not only at the bottom but also at the side surfaces of the third well in addition to the conductive layer under the second well, so that the minority carriers are absorbed in the portion and injection of the carriers both from under and the side of the second well into the first well can be prevented.

In still another preferred embodiment of the present invention, a conductive layer including the first conductivity type impurities is formed at the boundary between the second well and the first well in addition to a conductive layer under the second well and, furthermore, the bottom portion and the side portions of the third well are adapted to have a first conductivity type impurity layer having a higher concentration than the impurity concentrations of the first and third wells, so that capture of the minority carriers by recombination is further promoted and injection of the carriers into the first well further controlled.

The first and third wells and the second well each include impurities of a prescribed conductivity type implanted by high energy ion implantation. The high energy ion implantation is preferably carried out in two or more steps in order to control the impurity concentration profile in the direction of the depth of each well.

Each conductive layer of the first conductivity type needs to have an impurity concentration of $1 \times 10^{18}/cm^3$ or more in order to cause the minority carriers to fully recombine there.

In a method of manufacturing a semiconductor device including a double structured well according to the present invention, firstly impurities having a first conductivity type are implanted into a surface of a semiconductor substrate with a predetermined implantation energy and dose, so that a conductive layer is formed as a buried layer from the surface to a predetermined depth in a predetermined region of the semiconductor substrate. Thereafter, a mask having a predetermined pattern is formed on the semiconductor substrate and, impurities having a second conductivity type are implanted with a predetermined implantation energy and dose to form a plate-like well of the second conductivity type in a predetermined region directly on the conductive layer. Then, a mask of a predetermined pattern is formed over the semiconductor substrate and impurities of the second conductivity type are implanted with a predetermined implantation energy and dose to form a cylindrical well of the second conductivity type extending from the surface of the semiconductor substrate to the well of the second conductivity type, surrounding the periphery of the well of the second conductivity type. Thereafter, a mask having a predetermined pattern is formed over the semiconductor substrate and impurities of the first conductivity type are implanted with a predetermined implantation energy and dose to form a well of the first conductivity type in a region surrounded by the plate-like well of the second conductivity type and the cylindrical well of the second conductivity type and in the vicinity of the outside of the cylindrical well of the second conductivity type.

In accordance with the manufacturing method, there is an advantage that it is easier to control a concentration profile of impurities according to a design compared with a case of formation by thermal diffusion as the double well structure and the conductive layer are formed by patterning of the resist masks and ion implantation where the implantation energies and the doses are controlled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
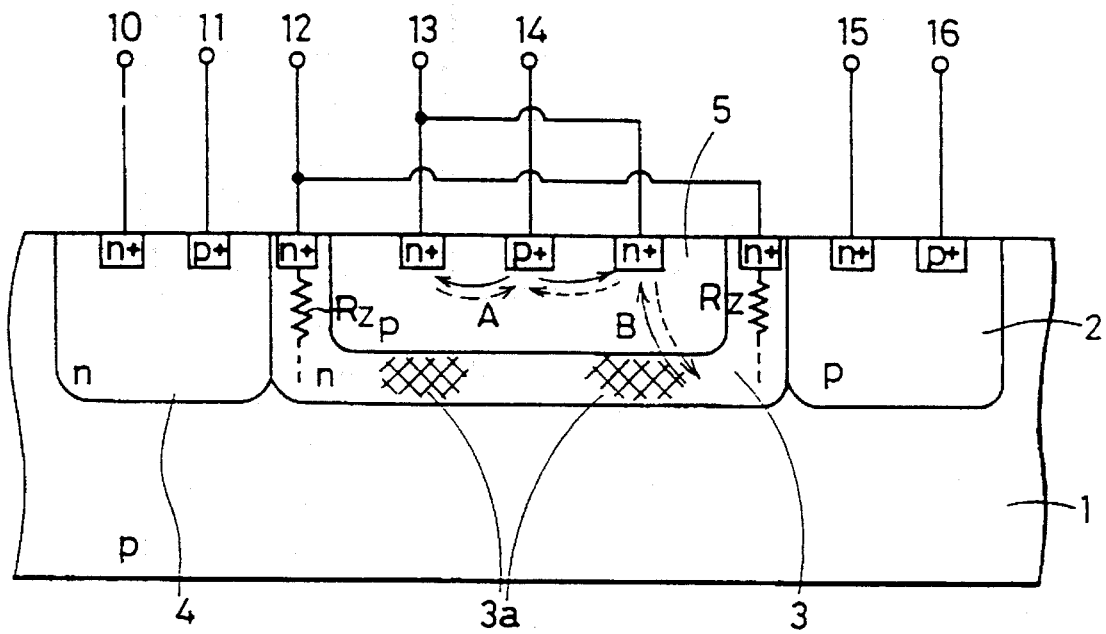
FIG. 1 is a diagram showing a cross-sectional structure of a conventional semiconductor device having a double structured well in a first manner.
Figure 5A:
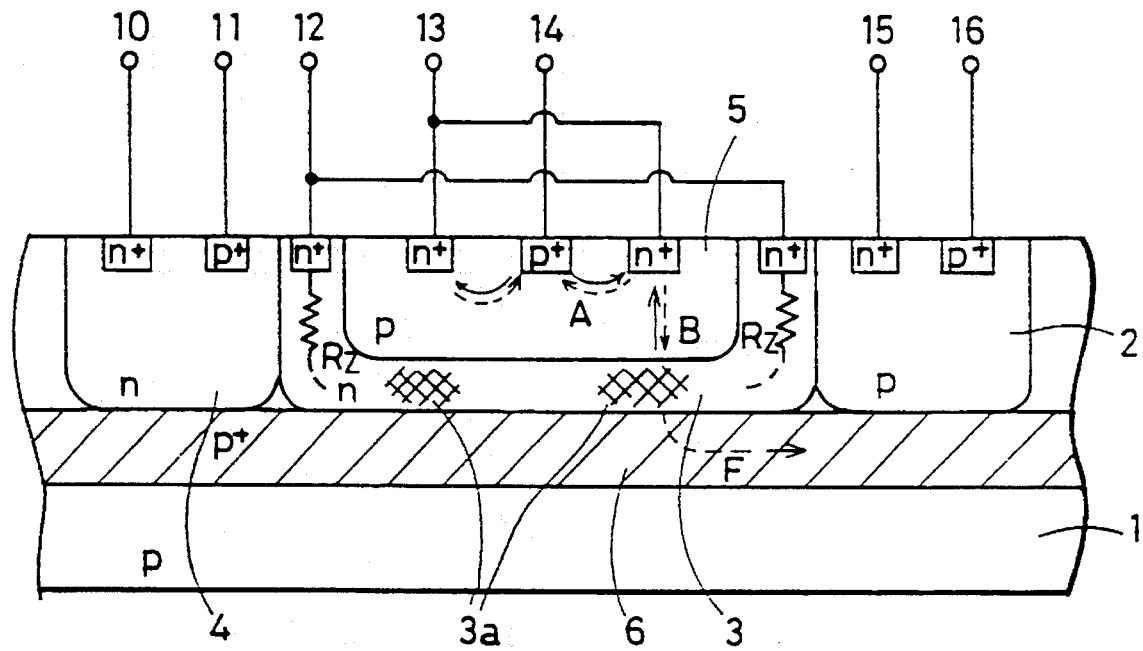
FIG. 5A is a diagram showing a cross-sectional structure of a semiconductor device according to a first embodiment of the present invention in a first manner.

A first embodiment according to the present invention will now be described with reference to FIGS. 5A and 5B. FIG. 5A shows a structure of a semiconductor device of this embodiment corresponding to the structure shown in the conventional example of FIG. 1. Referring to FIG. 5A, the semiconductor device has a p well 2 as a first well, an n well 3 as a second well and an n well 4 as a fourth well formed adjacent to each other from the surface of a p-type silicon substrate 1 to a prescribed depth. A p well 5 as a third well is formed inside the n well 3 and, furthermore, a conductive layer 6 including p-type impurities of high concentration is formed from the position of each bottom surface of p well 2, n well 3 and n well 4 to a prescribed depth.

The operation according to the embodiment will now be described with reference to FIG. 5A When a terminal 13 connected to an n⁺ layer on the surface of p well 5 inside n well 3, by picking up an external noise, attains a lower potential than that of a terminal 14 connected to a p⁺ potential than that of a terminal 14 connected to a p⁺ layer on the surface of p well 5, a current flows between terminal 13 and terminal 14 in the direction indicated by the solid line of an arrow A. Then, the current amplified by the bipolar operation flows into terminal 13 from n well 3 as indicated by the solid line of an arrow B. Subsequently, the potential of a region 3 a of n well 3 located under the n⁺ layer of p well 5 is decreased due to a resistance component $R_z$ of n well 3, and minority carriers of electrons are about to be injected to the p well as indicated by an arrow F of a broken line. However, as a conductive layer 6 is provided, the electrons recombine and disappear in conductive layer 6 without diffusing as far as p well 2. Accordingly, they are not injected into p well 2. The directions indicated by the broken lines of arrows A, B represent moving directions of electrons.

Figure 2:
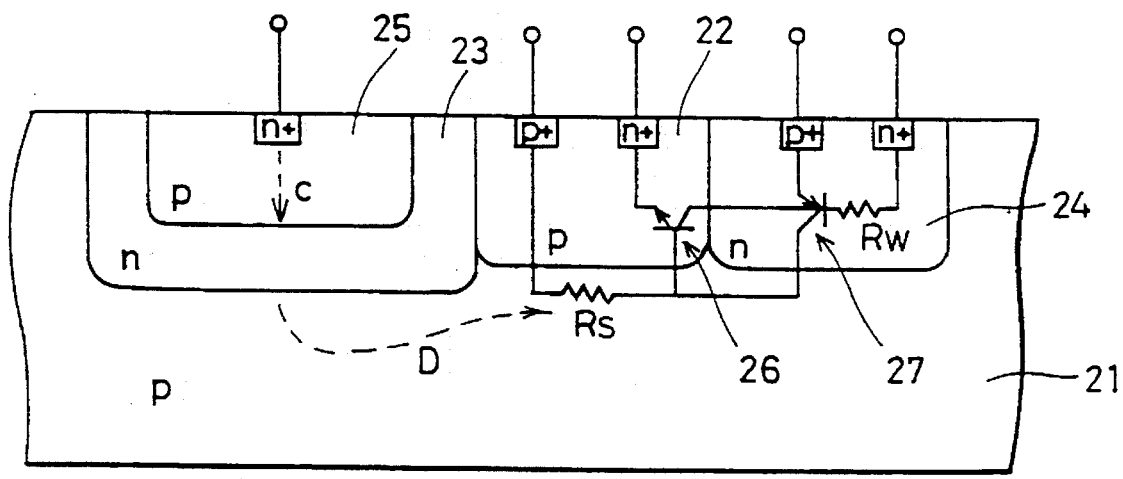
FIG. 2 is a diagram showing a cross-sectional structure of the conventional semiconductor device having the double-structured well in a second manner.
Figure 3:
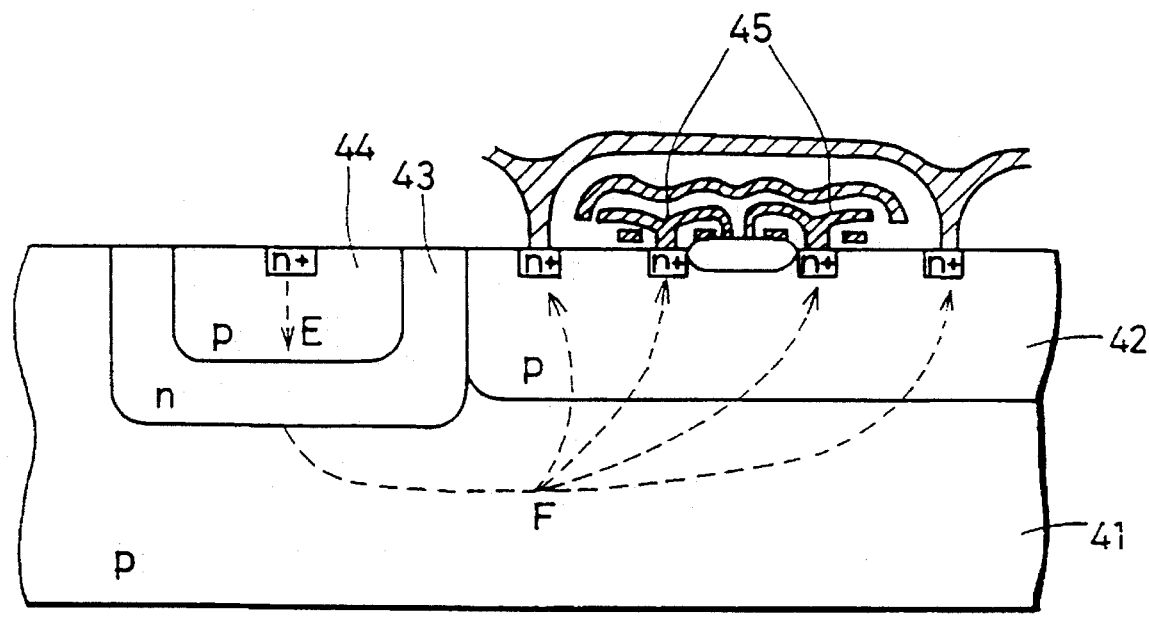
FIG. 3 is a cross-sectional view for describing penetration of minority carriers into a memory cell of a conventional DRAM having a double-structured well.
Figure 4:
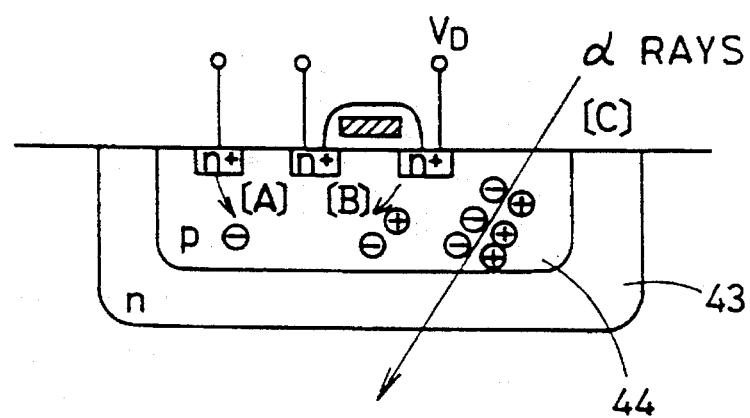
FIG. 4 is a cross-sectional view of a double-structured well for describing three cases where injection of minority carriers is caused.
Figure 5B:
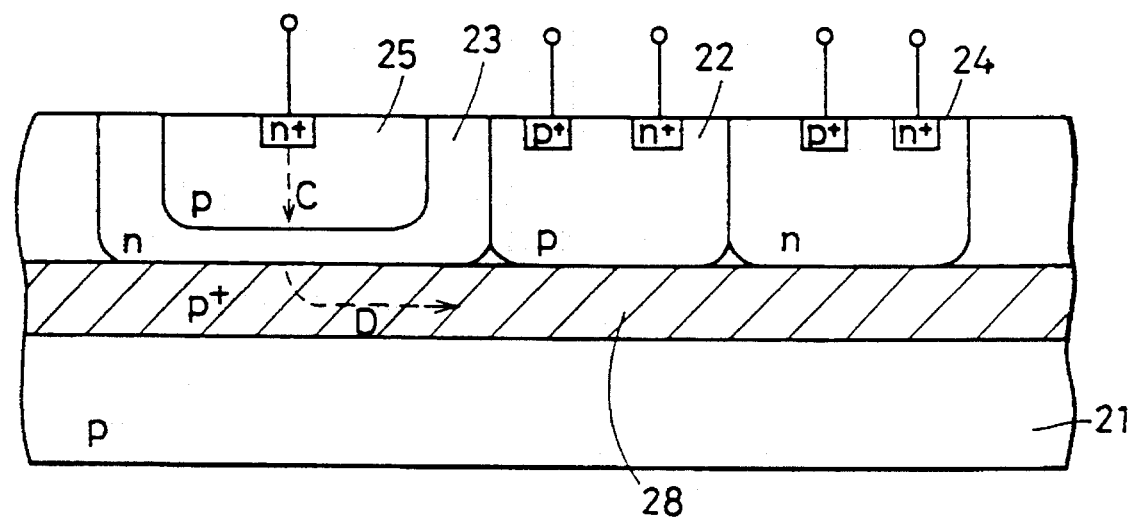
FIG. 5B is a diagram showing a cross-sectional structure of the same in a second manner.

FIG. 5B shows a structure of the semiconductor device according to a first embodiment of the present invention corresponding to the conventional structure shown in FIG. 2. A conductive layer 28 including p-type impurities of high concentration is formed from the bottom surfaces of a p well 22 as a first well, an n well 23 as a second well and an n well 24 as a fourth well to a prescribed depth. In this state as well, even if minority carriers of electrons are injected in a p well 25 as a third well formed inside n well 23 as indicated by an arrow C, they move in the direction of an arrow D, recombine within conductive layer 28 and disappear. Accordingly, the electrons are not injected into p well 22.

The structure according to this embodiment is suitable for a case where areas of p wells 5, 25 are relatively large for the depth thereof, that is, the ratio of the width to the depth is 1 or more, or a case where the resistance value of n well 3 is comparatively large and the sheet resistance value is 1 $\Omega/\square$ or more.

While examples of circuits of the semiconductor device according to this embodiment, in practice, are a memory cell, a sense amplifier or the like formed on p well 2 and an input/output circuit, a substrate potential generation circuit, a boost circuit, a precharge circuit or the like formed on p well 5, it is also adaptable to a case where the circuit in p well 2 and the circuit in p well 5 are interchanged.

Figure 6A:
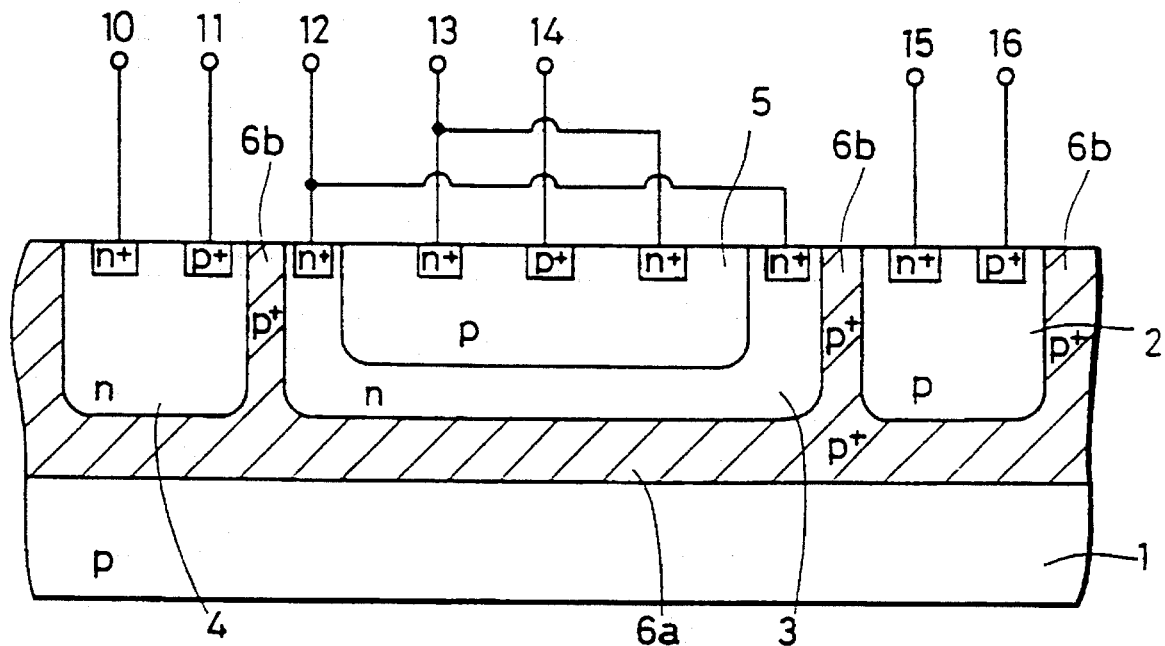
FIG. 6A is a diagram showing a cross-sectional structure of a semiconductor device according to a second embodiment of the present invention and FIG. 6B is an enlarged view of the main portion thereof.

A second embodiment according to the present invention will now be described with reference to FIGS. 6A and 6B. Referring to FIG. 6A, a semiconductor device according to this embodiment includes a conductive layer 6a including p-type impurities of high concentration formed from the position of the bottom surfaces of p well 2, n well 3 and n well 4 to a prescribed depth in the same way as in the first embodiment above. Additionally, in this embodiment, a conductive layer 6b including p-type impurities of high concentration is formed at the boundary between p well 2 and n well 3, and the boundary between n well 3 and n well 4 and on the outside of the sidewalls of p well 2 and n well 4.

Figure 6B:
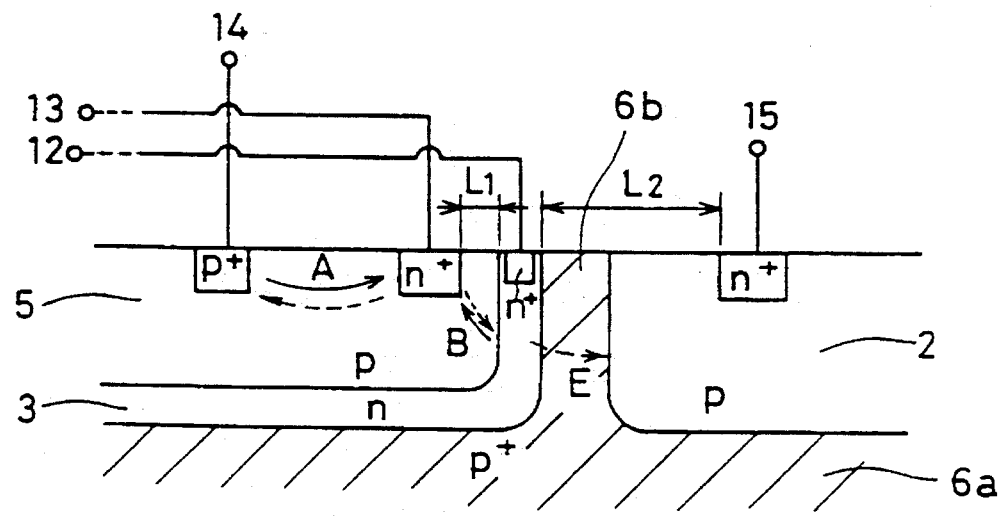

Referring to FIG. 6B, the operation according to this embodiment is as follows. If the n⁺ layer connected to a terminal 13 within p well 5 becomes closer to the boundary with n well 3, the minority carriers move in the path closer to n well 3, i.e., in the lateral direction indicated by an arrow B in the figure. Accordingly, in this case, a region 3a of low potential within n well 3 is not formed below the n⁺ layer connected to terminal 13. As a result, while the minority carriers are about to penetrate conductive layer 6a and be injected into p well 2 from the lateral direction, conductive layer 6b provided between p well 2 and n well 3 absorbs the minority carriers, preventing the injection into p well 2.

The structure according to this embodiment is suitable for a case where the distance $L_1$ between the periphery of p well 5 and the n⁺ layer connected to terminal 13 is relatively shorter than the distance $L_2$ shown in FIG. 6B.

In this embodiment, there is an effect that the amplified current from n well 3 to a terminal 15 is stopped and injection of the minority carriers into p well 5 is controlled in a case where an external noise is supplied to terminal 15 as well as a case where an external noise is supplied to terminal 13.

A third embodiment according to the present invention will now be described with reference to FIGS. 7A and 7B. In this embodiment, referring to FIG. 7A, a region 7 including p-type impurities of high concentration is provided at the bottom and side surfaces of p well 5 in addition to the same conductive layer 6 as that in the first embodiment above.

Figure 7A:
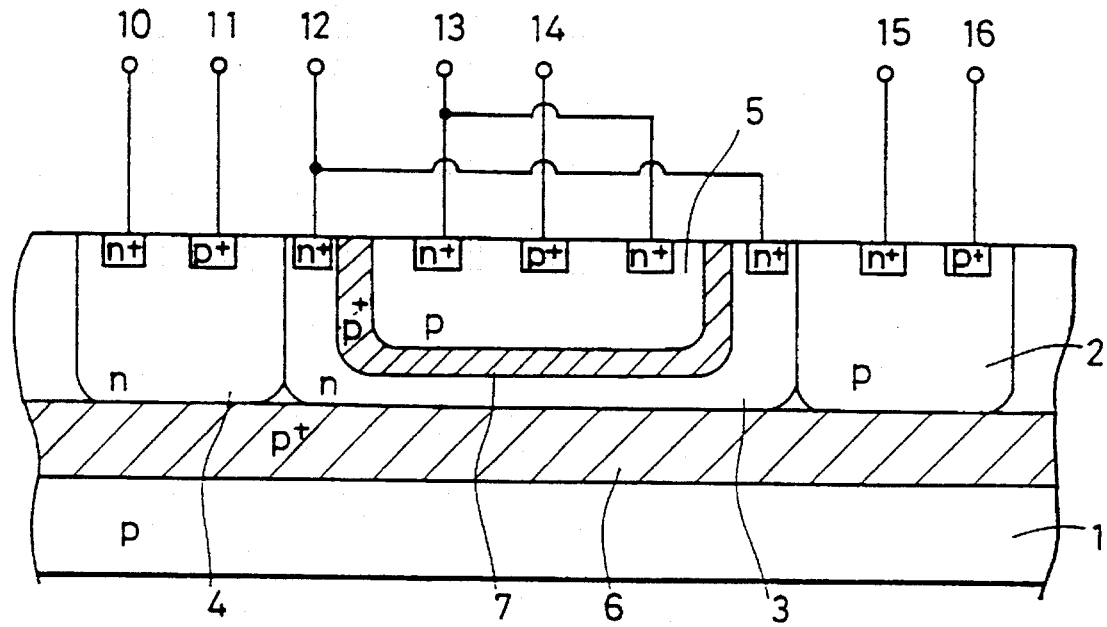
FIG. 7A is a diagram showing a cross-sectional structure of a semiconductor device according to a third embodiment of the present invention and FIG. 7B is an enlarged view of the main portion thereof.
Figure 7B:
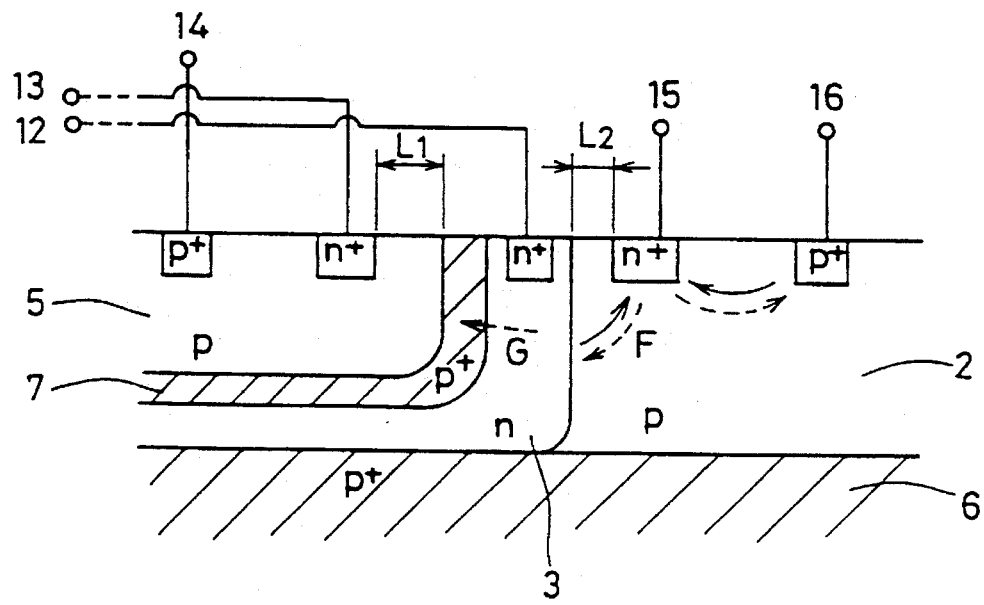

Referring to FIG. 7B, in accordance with this structure, even if injection of minority carrier is caused in the direction indicated by the broken line of an arrow F and they move in the direction indicated by an arrow G when an external noise is supplied to a terminal 15, the carriers are absorbed in the region 7, preventing the injection into p well 5. Accordingly, this embodiment is mainly applied to a case where the size $L_2$ is relatively small compared with $L_1$ as shown in FIG. 7B. According to this embodiment, it is possible to prevent the minority carriers injected from a terminal 13 from being injected into p well 2.

A description will be made below of conditions for impurity implantation for forming a p well, an n well, an $n^+$ layer, or a conductive layer including p-type impurities of high concentration and so on in each embodiment above. The impurity implantation conditions in each portion are as shown in table 1.

TABLE 1

| | impurities to be implanted | implantation energy and dose |
|---|---|---|
| p well 2, 5 | B (boron) ions | first time: 300 KeV–1 MeV, $10^{12}$–$10^{14}$/cm$^2$ second time: 50 KeV–300 KeV, $10^{11}$–$10^{13}$ /cm$^2$ |
| n well 3, 4 | P (phosphorus) ions | first time: 500 KeV–1.5 MeV, $10^{12}$–$10^{14}$ cm$^2$ second time: 100 KeV–500 KeV, $10^{11}$–$10^{13}$/cm$^2$ |
| n$^+$ layer | P ions | 1.5–3 MeV, $10^{12}$–$10^{15}$/cm$^2$ |
| conductive layer 6, 6a, 6b region 7 | B ions | 1–3 MeV, $10^{12}$–$10^{15}$/cm$^2$ |

The reason why the impurity implantation conditions above are selected is as follows. At first, as the depth of implantation is determined by implantation energy, the implantation energy is selected according to the cross-sectional structure such as each well, a conductive layer and so on. The dose is selected as follows with respect to each well, the conductive layer and, the n$^+$ layer, respectively. At first, such a range is selected for p, n wells that the concentration is such a high degree that it does not affect the device characteristic and such a low degree that a punch through is not caused between the source/drain of a transistor and so on. In the case of the n$^+$ layer, such a range is selected that the sheet resistance value does not become 1 Ω/□ or more. In forming conductive layers 6, 6a, 6b and region 7, such a range is selected that the minority carriers are efficiently diminished, and in a case where the p-type impurities are boron, the concentration needs to be at least $1\times10^{18}$/cm$^3$.

Though p wells 2, 5 and n wells 3, 4 are formed by ion implantation in two steps under the impurity implantation conditions shown in table 1 above, it is also possible to employ ion implantation in three or more steps as required. Generally, it is possible to control the impurity concentration profile in the direction of the depth of each well more flexibly by changing the ion implantation conditions over a plurality of steps.

A fourth embodiment according to the present invention will now be described with reference to FIGS. 8A and 8B. This embodiment corresponds to a combination of the structures in the second and third embodiments above. That is, a conductive layer 6a including p-type impurities of high concentration is formed from the bottom surfaces of a p well 2, an n well 3 and an n well 4 to a prescribed depth and a conductive layer 6b is formed at the boundary between the wells or at the periphery of the each well. Furthermore, a region 7 including p-type impurities of high concentration is also formed at the bottom and side surfaces of a p well 5 formed inside n well 3.

According to this embodiment, an effect obtained by combining the second and third embodiments can be achieved. Accordingly, it can be applied to a case where the sizes $L_1$, $L_2$ are both short as shown in FIG. 8B.

As we have seen, in accordance with each embodiment above, it is possible to prevent penetration of minority carriers into an element which is likely to be destroyed by injection of minority carriers, by providing, as required, a conductive layer including impurities of high concentration having a conductivity type which captures the minority carriers in a region where injection of the minority carriers is caused. As a result, for example, various disadvantageous phenomena due to injection of minority carriers caused by an external noise and so on are prevented and a semiconductor device having a high integration density and stable device characteristic can be obtained.

A description will now be made of a method of manufacturing a semiconductor device including a double structured well according to the present invention.

As a first embodiment of a method of manufacturing a semiconductor device including a double structured well according to the present invention, a description will be made of one example of a method of manufacturing the semiconductor device shown in FIG. 5A in connection with the first embodiment of the semiconductor device of the present invention, with reference to FIGS. 9–13.

Figure 9:
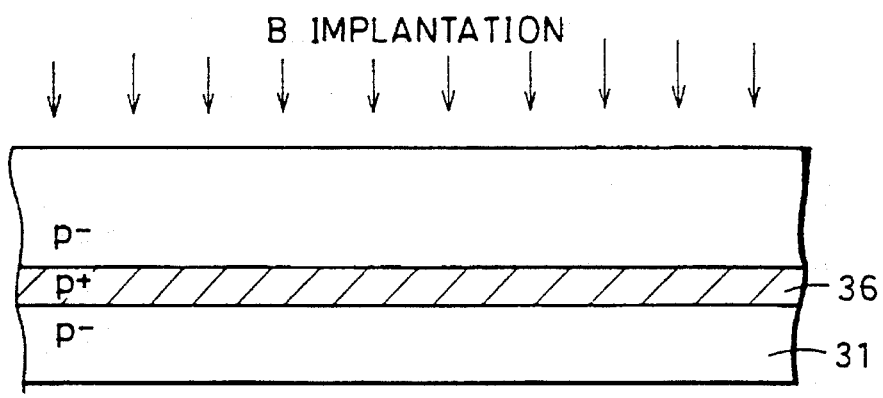
FIGS. 9, 10, 11, 12 and 13 are cross-sectional views of models showing in order processes in a method of manufacturing a semiconductor device including a double structured well in accordance with a first embodiment of the present invention.

According to this embodiment, firstly, referring to FIG. 9, boron is implanted into a p-type silicon substrate 31 doped with boron of $10^{15}$/cm$^3$ or less with an implantation energy of 1–3MeV and a dose of $10^{12}$–$10^{15}$ cm$^2$ to form a buried p-type conductive layer 36 having a concentration of $10^{18}$/cm$^3$ or more from the surface of a silicon substrate 1 to a depth of about 4 μm.

Figure 10:
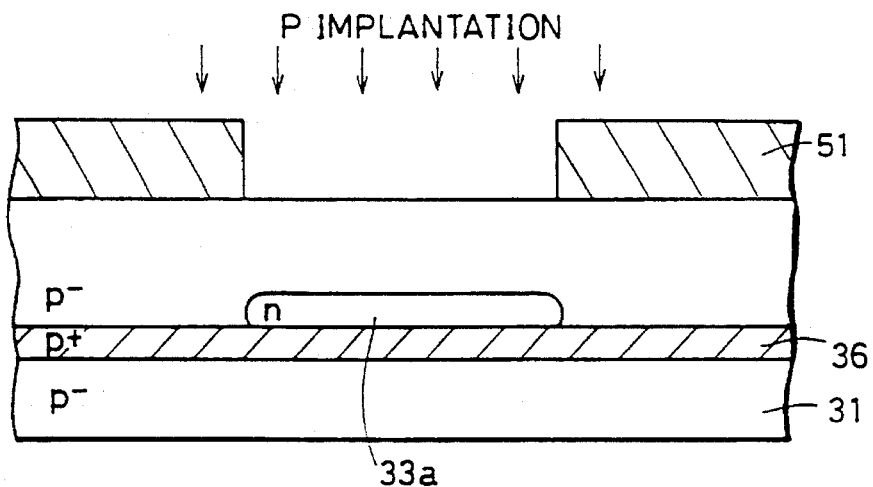
Figure 11:
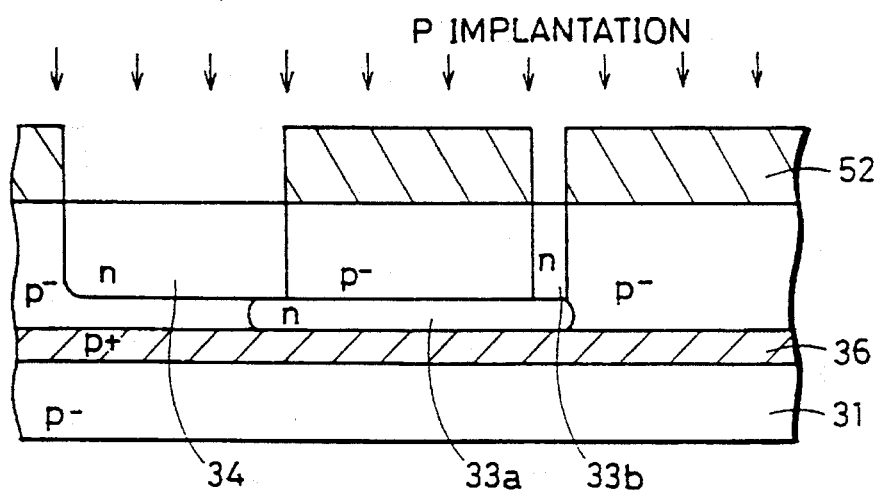

Then, referring to FIG. 10, after forming a resist mask 51 having a predetermined pattern, phosphorus is implanted with an implantation energy of 500KeV–1.5MeV and a dose of $10^{12}$–$10^{14}$/cm$^2$ to form a buried n well 33a having a concentration of $10^{16}$–$10^{19}$/cm$^3$ directly on conductive layer 36. Thereafter, referring to FIG. 11, resist mask 51 is removed, a resist mask 52 having a predetermined pattern is formed, and phosphorus is implanted with the implantation energy of 500KeV–1.5MeV and the dose $10^{12}$–$10^{14}$/cm$^2$ for the first time and with the implantation energy of 100KeV–500KeV and the dose of $10^{11}$ –$10^{13}$/cm$^2$ for the second time to form an n well 33b and an n well 34.

Figure 12:
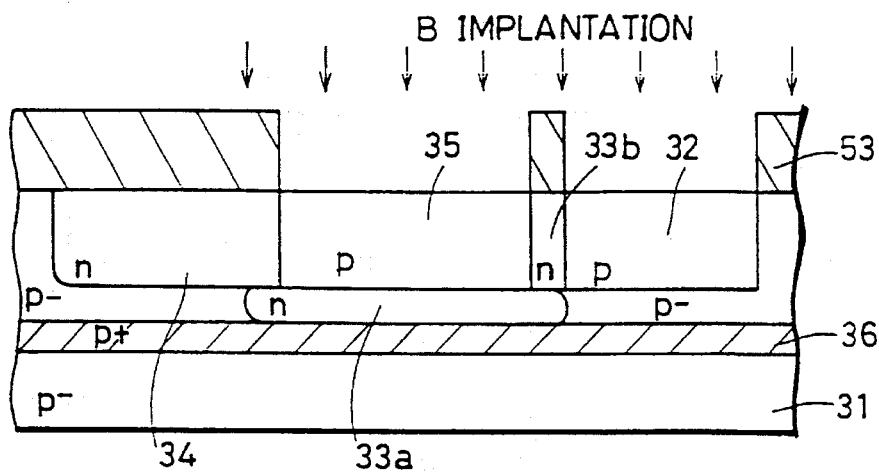
Figure 13:
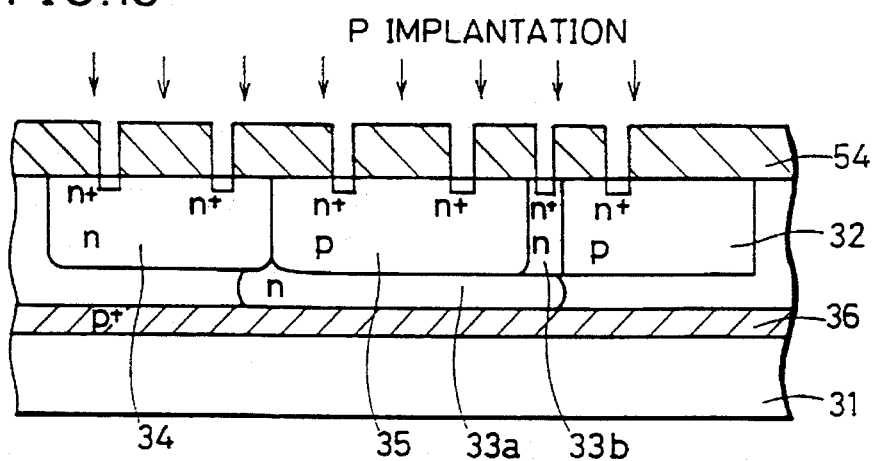
Figure 14:
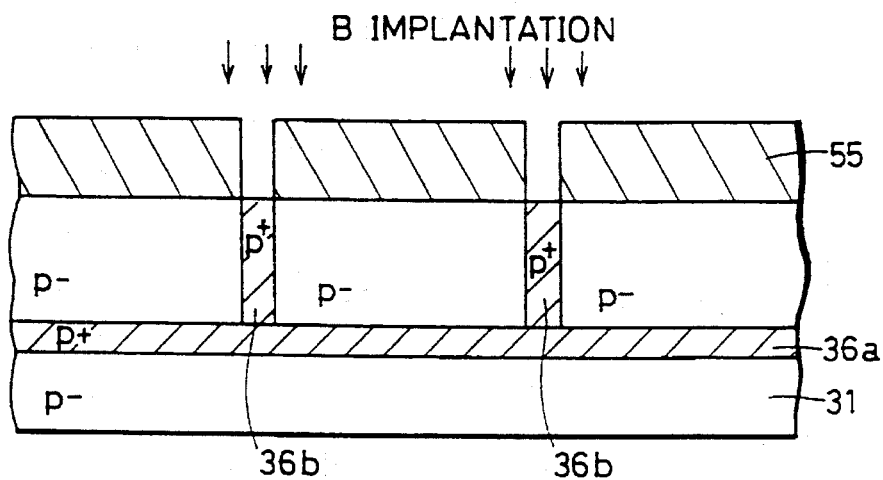
FIGS. 14, 15, 16 and 17 are cross-sectional views of models showing in order processes in a method of manufacturing a semiconductor device including a double structured well in accordance with a second embodiment of the present invention.
Figure 15:
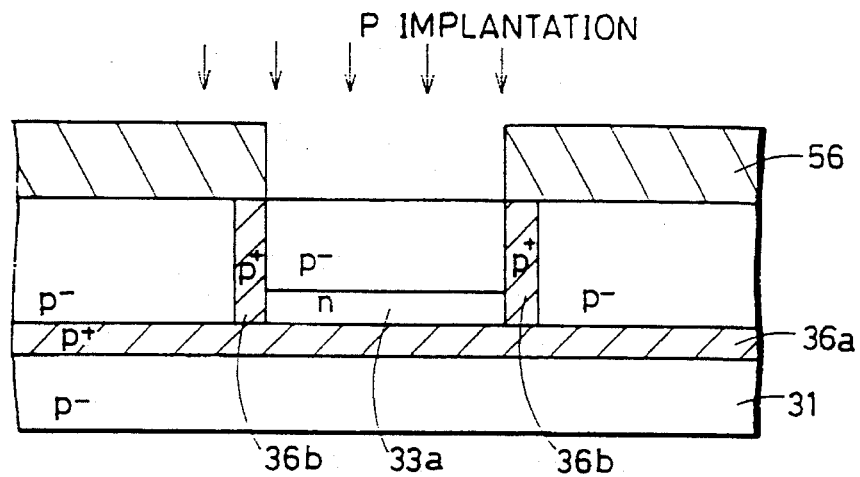

Then, referring to FIG. 12, after removing resist mask 52 and forming a resist mask 53 having a predetermined pattern, boron is implanted with the implantation energy of 300KeV–1MeV and the dose $10^{12}$–$10^{14}$/cm$^2$ for the first time and with the implantation energy of 50KeV–300KeV and the dose of $10^{11}$–$10^{13}$/cm$^2$ for the second time to form a p well 32 and a p well 35. Referring to FIG. 13, resist mask 53, is then removed, a resist mask 54 with a predetermined pattern is formed and phosphorus is implanted with the implantation energy of 1.5–3.0MeV and the dose of $10^{12}$–$10^{15}$/cm$^2$ to form an n$^+$ type layer to be connected to an electrode terminal.

In accordance with the manufacturing method described above, since the double well structure and the conductive layer 36 are formed by patterning of the resist masks and ion implantation where the implantation energies and the doses are controlled, there is an advantage that it is easier to control an impurity concentration profile according to a design than it is in forming by a thermal diffusion method.

One example of a method of manufacturing the semiconductor device shown in FIG. 6A will now be described with reference to FIGS. 14–17 as a second embodiment of the method of manufacturing the semiconductor device having a double structured well according to the present invention.

In this embodiment, firstly, a conductive layer 36 is formed in the same way as the manufacturing process according to the first embodiment shown in FIG. 9. Then, referring to FIG. 14, a resist mask 55 having a predetermined pattern is formed and boron is implanted with the implantation energy of 1–3MeV and the dose of $10^{12}$–$10^{16}$/cm$^2$ to form a longitudinally extending conductive layer 36b. Thereafter, referring to FIG. 15, resist mask 55 is removed, a resist mask 56 of a predetermined pattern is formed and phosphorus is implanted with the implantation energy of 500KeV–1.5MeV and the dose of $10^{12}$–$10^{14}$/cm$^2$ to form an n well 33 a.

Figure 16:
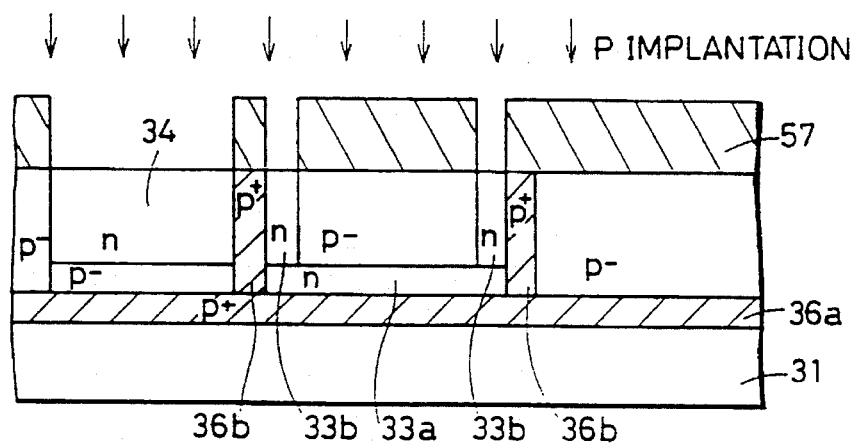
Figure 17:
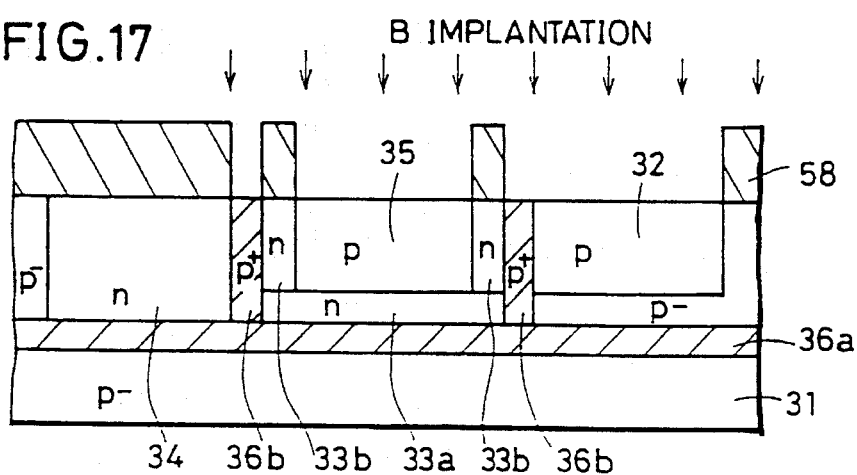

Referring to FIG. 16, after removing resist mask 56, a resist mask 57 of a predetermined pattern is formed and phosphorus is implanted with the implantation energy of 500KeV–1.5MeV and the dose of $10^{12}$–$10^{14}$/cm$^2$ for the first time and with the implantation energy of 100KeV–500KeV and the dose of $10^{11}$–$10^{13}$/cm$^2$ for the second time to form an n well 33b and an n well 34. Thereafter, resist mask 57 is removed, a resist mask 48 of a predetermined pattern is formed and boron is implanted with the implantation energy of 300KeV–1MeV and the dose of $10^{12}$–$10^{14}$/cm$^2$ for the first time and with the implantation energy of 50KeV–300KeV and the dose of $10^{11}$–$10^{13}$/cm$^2$ for the second time to form a p well 32 and a p well 35. An n$^+$ layer is then formed in the same way as in the process of the method according to the first embodiment shown in FIG. 13, so that a structure similar to the semiconductor device shown in FIG. 6A is completed.

As a third embodiment of the method of manufacturing the semiconductor device having a double structured well according to the present invention, one example of a method of manufacturing the semiconductor device shown in FIG. 7A will now be described with reference to FIGS. 18–21.

Figure 18:
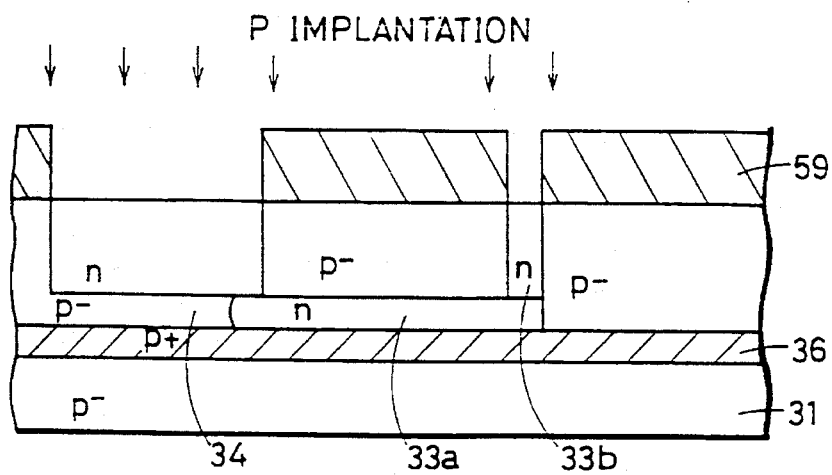
FIGS. 18, 19, 20 and 21 are cross-sectional views of models showing in order processes in a method of manufacturing a semiconductor device including a double structured well according to a third embodiment of the present invention.
Figure 19:
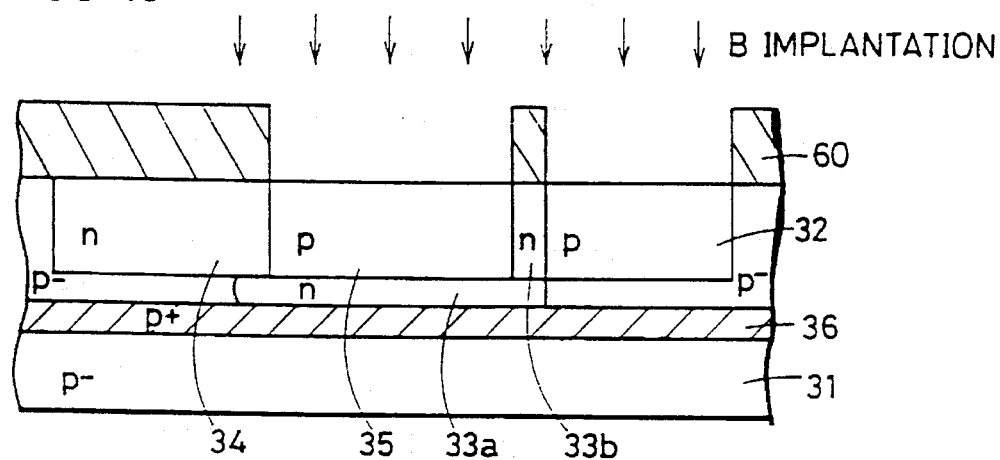

In this embodiment, after the same processes as those shown in FIGS. 9 and 10 which were described in connection with the manufacturing method according to the first embodiment, a resist mask 59 having a predetermined pattern is formed and phosphorus is implanted with the implantation energy 500KeV–1.5MeV and the dose $10^{12}$–$10^{14}$/cm$^2$ for the first time and with implantation energy of 100KeV–500KeV and the dose of $10^{11}$–$10^{13}$/cm$^2$ for the second time to form n wells 33b and 34 as shown in FIG. 18. Resist mask 59 is then removed, a resist mask 60 of a predetermined pattern is formed and boron is implanted with the implantation energy of 300KeV–1MeV and the dose of $10^{12}$–$10^{14}$/cm$^2$ for the first time and with the implantation energy of 50KeV–300KeV and the dose of $10^{11}$–$10^{13}$/cm$^2$ for the second time to form p wells 32 and 35 as shown in FIG. 19.

Figure 20:
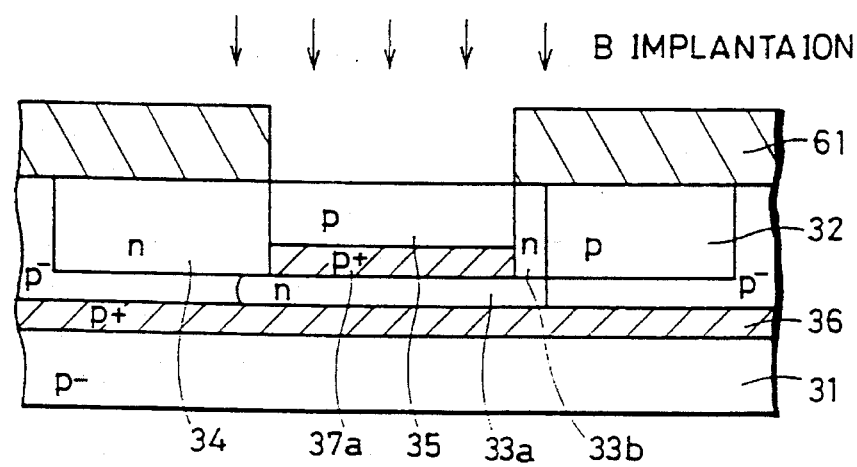
Figure 21:
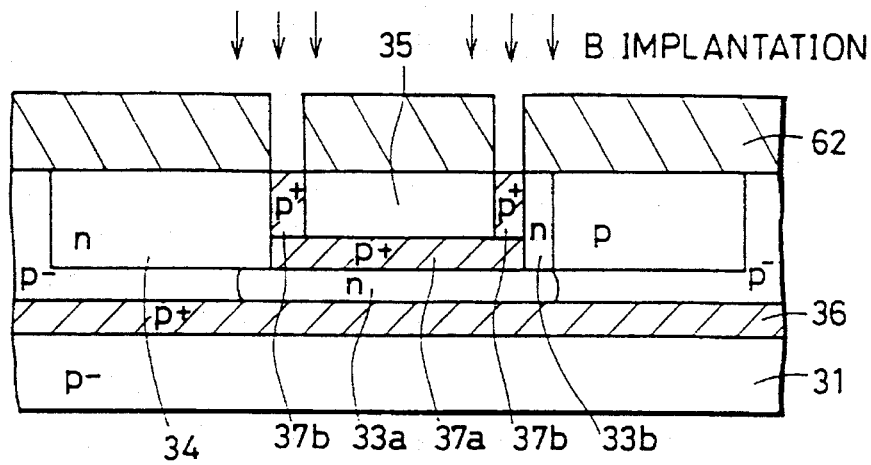

Subsequently, after removing resist mask 60, a resist mask 61 of a predetermined pattern is formed and boron is implanted with the implantation energy of 1–3MeV and the dose of $10^{12}$–$10^{16}$/cm$^2$ to form a p-type conductive layer 37 a at the bottom of p well 35 as shown in FIG. 20. Resist mask 61 is then removed, a resist mask 62 of a predetermined pattern is formed and boron is implanted with the implantation energy of 1–3MeV and the dose of $10^{12}$–$10^{16}$/cm$^2$ to form a p-type conductive layer 37b as shown in FIG. 21.

According to this embodiment, a well structure similar to that shown in FIG. 7A is formed by the same effects as in the manufacturing method according to the first embodiment.

As a fourth embodiment of the method of manufacturing the semiconductor device having a double structured well according to the present invention, one example of a method of manufacturing the semiconductor device shown in FIG. 8A will now be described with reference to FIGS. 22–25.

Figure 22:
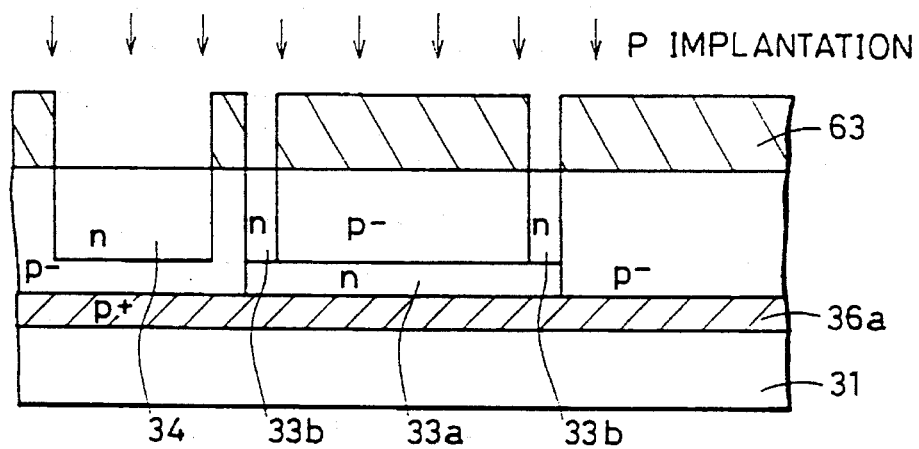
FIGS. 22, 23, 24 and 25 are cross-sectional views of models showing in order processes in a method of manufacturing a semiconductor device including a double structured well according to a fourth embodiment of the present invention.
Figure 23:
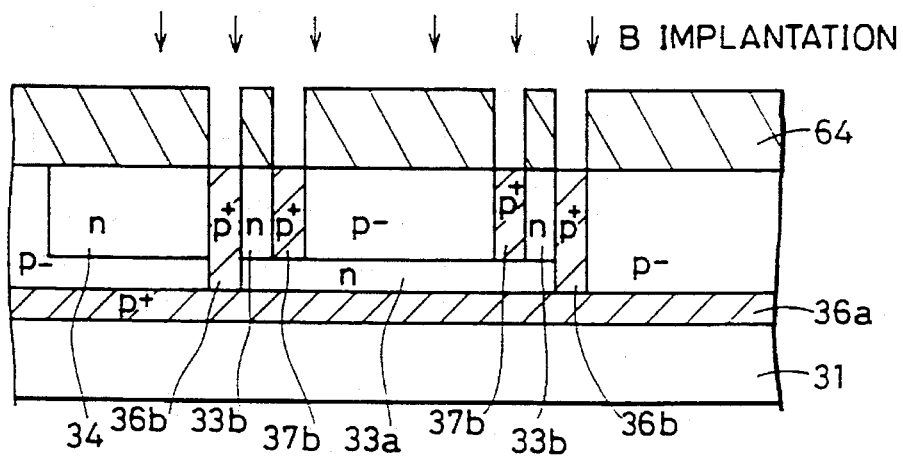

In accordance with this embodiment, after the same processes as those shown in FIGS. 9 and 10 which were described in connection with the manufacturing method according to the first embodiment, a resist mask 63 of a predetermined pattern is formed as shown in FIG. 22. Phosphorus is then implanted with the implantation energy of 500KeV–1.5MeV and the dose of $10^{12}$–$10^{14}$/cm$^2$ for the first time and with the implantation energy of 100KeV–500KeV and the dose of $10^{11}$–$10^{13}$/cm$^2$ for the second time to form n wells 33b and 34. Resist mask 63 is then removed and a resist mask 64 having a predetermined pattern is formed as shown in FIG. 23. Boron is then implanted with the implantation energy of 1–3MeV and the dose of $10^{12}$–$10^{16}$/cm$^2$ to form p-type conductive layers 36b and 37b.

Figure 24:
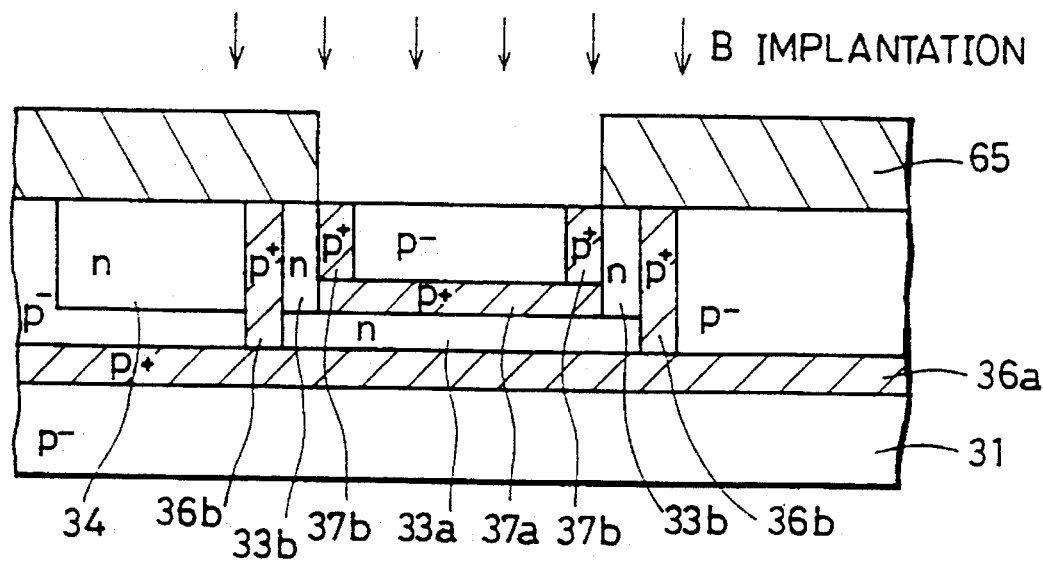
Figure 25:
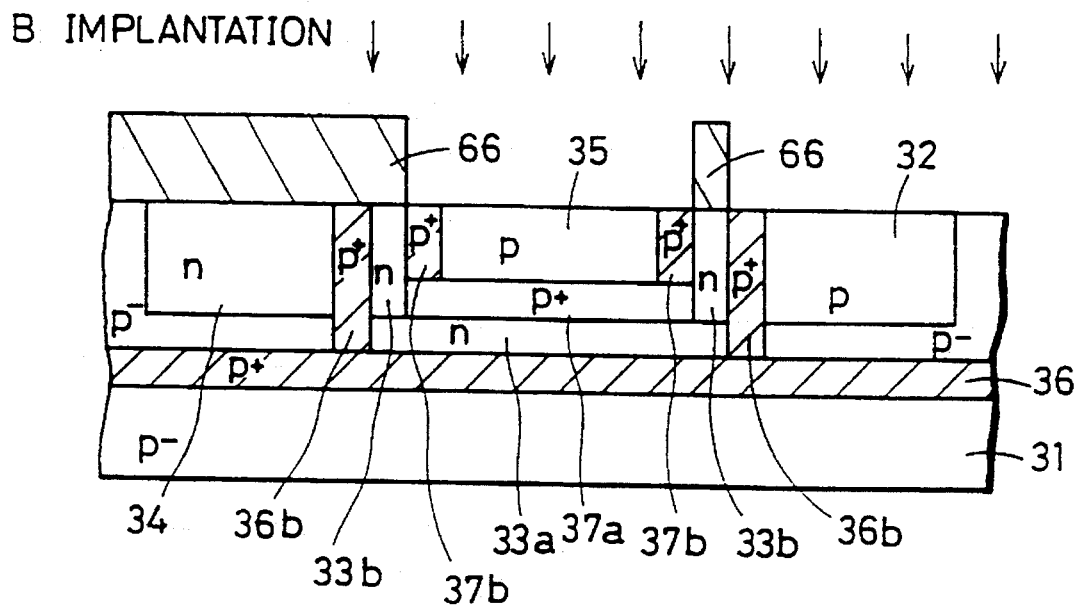

Resist mask 64 is then removed and a resist mask 65 having a predetermined pattern is formed as shown in FIG. 24. Boron is then implanted with the implantation energy of 1–3MeV and the dose of $10^{12}$–$10^{16}$/cm$^2$ to form a p-type conductive layer 37a. Subsequently, resist mask 65 is removed and a resist mask 66 of a predetermined pattern is formed as shown in FIG. 25. Boron is then implanted with the implantation energy of 300KeV–1MeV and the dose $10^{12}$–$10^{14}$/cm$^2$ for the first time and with the implantation energy of 50KeV–300KeV and the dose of $10^{11}$–$10^{13}$/cm$^2$ for the second time to form p wells 32 and 35.

Figure 8A:
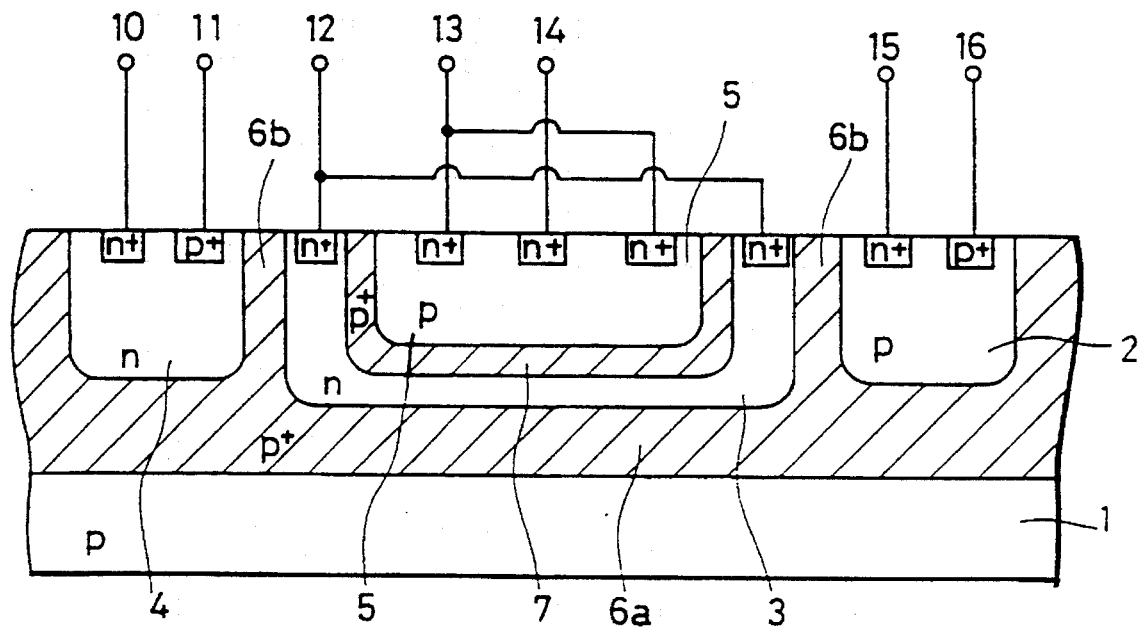
FIG. 8A is a diagram showing a cross-sectional structure of a semiconductor device according to a fourth embodiment of the present invention.
Figure 8B:
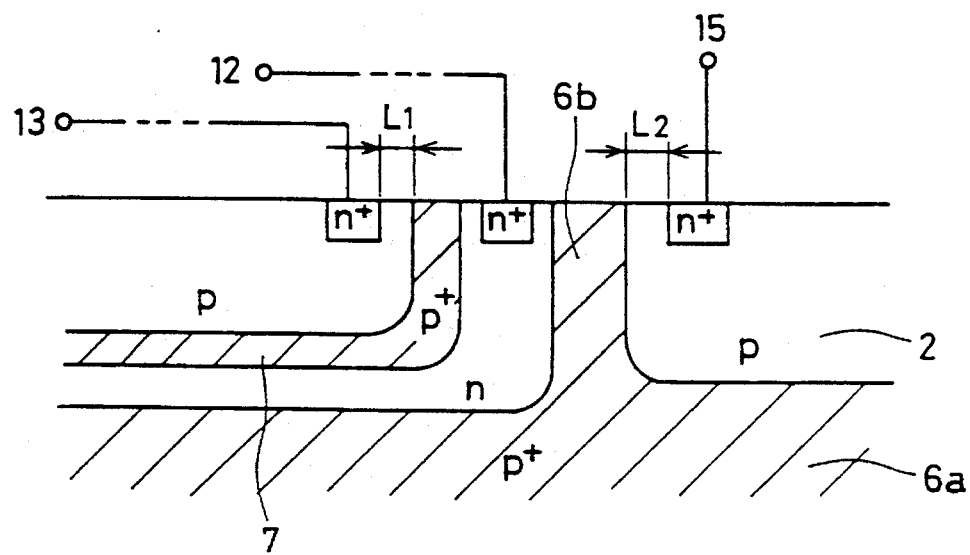
FIG. 8B is an enlarged view of the main portion thereof.

In accordance with this embodiment, a well structure similar to that shown in FIG. 8A is formed by the same effects as in the manufacturing method according to the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a double structured well, comprising the steps of:

implanting impurities having a first conductivity type in a surface of a semiconductor substrate with a prescribed implantation energy and dose and forming a buried conductive layer from the surface to a prescribed depth in a prescribed region of said semiconductor substrate;

forming a mask of a prescribed pattern on said semiconductor substrate, implanting impurities having a second conductivity type with a prescribed implantation energy and dose and forming a plate-like well having the second conductivity type in a prescribed region directly on said conductive layer;

forming a mask of a prescribed pattern over said semiconductor substrate, implanting impurities having the second conductivity type with a prescribed implantation energy and dose and forming a cylindrical well of the second conductivity type surrounding the periphery of said well of the second conductivity type and extending from the surface of said semiconductor substrate to said well of the second conductivity type; and forming a mask of a prescribed pattern over the semiconductor substrate, implanting impurities of the first conductivity type with a prescribed implantation energy and dose, and forming a well of the first conductivity type in a region surrounded by said plate-like well of the second conductivity type and said cylindrical well of the second conductivity type and in the vicinity of the outside of said cylindrical well of the second conductivity type.

2. The method of manufacturing the semiconductor device having the double structured well according to claim 1, further comprising a step of forming a mask of a prescribed pattern over said semiconductor substrate, implanting impurities of the first conductivity type with a prescribed implantation energy and dose, and forming a cylindrical conductive layer so as to surround the outer periphery of said cylindrical well of the second conductivity type.

3. The method of manufacturing the semiconductor device having the double structured well according to claim 1, further comprising a step of forming a mask of a prescribed pattern over said semiconductor substrate, implanting impurities of the first conductivity type with a prescribed implantation energy and dose, and forming a cylindrical conductive layer in a region between the outer periphery of said well of the first conductivity type and said cylindrical well of the second conductivity type and a plate-like conductive layer in a region between the bottom surface of said well of the first conductivity type and said plate-like well of the second conductivity type.

4. The method of manufacturing the semiconductor device having the double structured well according to claim 1, wherein said step of forming said buried conductive layer includes implanting boron with an implantation energy of 1–3MeV and a dose of $10^{12}$–$10^{15}$/cm$^2$.

5. The method of manufacturing the semiconductor device having the double structured well according to claim 1, wherein said step of forming said plate-like well of the second conductivity type includes implanting phosphorus with an implantation energy of 500KeV–1.5MeV and a dose of $10^{12}$–$10^{14}$/cm$^2$.

6. The method of manufacturing the semiconductor device having the double structured well according to claim 1, wherein said step of forming said cylindrical well of the second conductivity type includes two steps of implantation of phosphorus with an implantation energy of 500KeV–1.5MeV and a dose of $10^{12}$–$10^{14}$/cm$^2$ for the first time and with the implantation energy of 100KeV–500KeV and the dose of $10^{11}$–$10^{13}$/cm$^2$ for the second time.

7. The method of manufacturing the semiconductor device having the double structured well according to claim 1, wherein said step of forming said well of the first conductivity type includes two steps of implantation of boron with an implantation energy of 300KeV–1MeV and a dose of $10^{12}$–$10^{14}$/cm$^2$ for the first time and with the implantation energy of 50KeV–300KeV and the dose of $10^{12}$–$10^{14}$/cm$^2$ for the second time.

8. The method of manufacturing the semiconductor device having the double structured well according to claim 2, wherein said step of forming said cylindrical conductive layer so as to surround the outer periphery of said cylindrical well of the second conductivity type includes implanting boron with an implantation energy of 1–3MeV and a dose of $10^{12}$–$10^{15}$/cm$^2$.

9. The method of manufacturing the semiconductor device having the double structured well according to claim 3, wherein said steps of forming the cylindrical conductive layer in the region between the outer periphery of said well of the first conductivity type and said cylindrical well of the second conductivity type and forming said plate-like conductive layer in the region between the bottom surface of said well of the first conductivity type and said plate-like well of the second conductivity type include implanting boron with an implantation energy of 1–3MeV and a dose of $10^{12}$–$10^{15}$/cm$^2$.

* * * * *